US007843247B1

(12) United States Patent  
Bazes (10) Patent No.: US 7,843,247 B1
(45) Date of Patent: Nov. 30, 2010

(54) METHOD AND APPARATUS FOR CONTROLLED VOLTAGE LEVEL SHIFTING

(75) Inventor: Mel Bazes, Haifa (IL)

(73) Assignee: Marvell Israel (M.I.S.L.) Ltd., Yokneam (IL)

(*) Notice: Subject to any disclaimer, the term of this patent is extended or adjusted under 35 U.S.C. 154(b) by 0 days.

(21) Appl. No.: 12/506,024

(22) Filed: Jul. 20, 2009

Related U.S. Application Data

(63) Continuation of application No. 12/118,178, filed on May 9, 2008, now abandoned, which is a continuation of application No. 11/254,601, filed on Oct. 19, 2005, now Pat. No. 7,375,575.

(60) Provisional application No. 60/653,221, filed on Feb. 14, 2005.

(51) Int. Cl.
*H03L 5/00* (2006.01)

(52) U.S. Cl. .......................................... 327/333; 326/68

(58) Field of Classification Search .................. 326/62, 326/63, 68, 80, 81; 327/333
See application file for complete search history.

(56) References Cited

U.S. PATENT DOCUMENTS

| 4,763,021 | A | * | 8/1988 | Stickel | ..................... 326/71 |
|---|---|---|---|---|---|
| 5,047,657 | A | | 9/1991 | Seevinck et al. | |
| 5,369,318 | A | | 11/1994 | Kuroda et al. | |
| 5,534,795 | A | | 7/1996 | Wert et al. | |
| 5,534,798 | A | | 7/1996 | Phillips et al. | |
| 5,663,663 | A | | 9/1997 | Cao et al. | |
| 5,751,168 | A | | 5/1998 | Speed, III et al. | |
| 5,757,712 | A | | 5/1998 | Nagel et al. | |
| 5,764,094 | A | | 6/1998 | Hatsuda | |
| 5,867,010 | A | | 2/1999 | Hinedi et al. | |
| 5,973,508 | A | | 10/1999 | Nowak et al. | |
| 5,986,472 | A | | 11/1999 | Hinedi et al. | |
| 6,097,215 | A | | 8/2000 | Bialas, Jr. et al. | |
| 6,160,421 | A | | 12/2000 | Barna | |
| 6,600,338 | B1 | | 7/2003 | Nguyen et al. | |
| 6,798,243 | B1 | | 9/2004 | Nguyen et al. | |
| 6,798,244 | B1 | | 9/2004 | Sharpe-Geisler | |
| 6,882,179 | B2 | | 4/2005 | Knee | |
| 7,030,695 | B2 | | 4/2006 | May et al. | |
| 7,148,734 | B2 | | 12/2006 | Tanzawa | |
| 7,375,575 | B1 | | 5/2008 | Bazes | |
| 7,609,097 | B2 | * | 10/2009 | Leonowich et al. | ......... 327/108 |

* cited by examiner

*Primary Examiner*—Lincoln Donovan
*Assistant Examiner*—William Hernandez (57) ABSTRACT

The disclosed technology provides a method of and an apparatus for voltage level shifting. A voltage level shifter includes two level shifting circuits and a differential amplifier. The differential amplifier forms a feedback loop with one level shifting circuit. The feedback loop controls the level shifting operation of both level shifting circuits. The differential amplifier can operate to provide a control signal that causes a level-shifted signal in the feedback loop to match a target signal. The two level shifting circuits can perform their level shifting operation based on the control signal.

18 Claims, 13 Drawing Sheets

METHOD AND APPARATUS FOR CONTROLLED VOLTAGE LEVEL SHIFTING

CROSS-REFERENCE TO RELATED APPLICATIONS

This application is a continuation of U.S. patent application Ser. No. 12/118,178, filed May 9, 2008, which is a continuation of U.S. patent application Ser. No. 11/254,601, filed Oct. 19, 2005, now U.S. Pat. No. 7,375,575, issued May 20, 2008, which claims the benefit under 35 U.S.C. §119(e) of U.S. Provisional Application No. 60/653,221, filed Feb. 14, 2005, all of which are incorporated herein by reference in their entirety.

BACKGROUND OF THE INVENTION

This invention relates to voltage level shifting, and more particularly to controlled voltage level shifting that is operable over various operating and environmental conditions.

Modern electronic products and devices are complex systems that include many sub-systems. For example, a computer system can include disk drives, random access memory, and graphics hardware, among other things. To facilitate integration and compatibility of different electronic components, industry standards organizations typically adopt operating and manufacturing standards for electronic components. Even with these standards, however, it can still be a challenge to satisfy the various requirements of different components.

Operating standards for an electronic component often specify voltage-related requirements. One such requirement is operating voltage. Components may require voltage source levels of +1.2 volts (V), +3.3 V, or +5.0 V, for example. Another voltage-related operating requirement may be voltage swing. A single power supply may not be able to accommodate the voltage requirements of all of the various sub-systems. More importantly, different sub-systems having different voltage-related requirements may need to communicate signals between each other. Therefore, a system may need voltage adjustment circuitry to integrate different components in an electronic system and to accommodate their voltage-related requirements.

One type of voltage adjustment circuit is a voltage level shifter, which receives a voltage waveform and, preferably, shifts the waveform by a desired voltage level without altering the shape or content of the waveform. High performance voltage level shifters are generally implemented using analog implementations, which can accommodate high frequency waveforms and which do not distort a waveform by sampling and quantization, as is common with digital implementations. However, an analog implementation may suffer from sensitivities to undesirable operating or environmental conditions, such as temperature variations and/or power supply noise, for example. Thus, it would be desirable to provide a high performance voltage level shifter that operates over a variety of operating and/or environmental conditions.

SUMMARY OF THE INVENTION

The disclosed technology provides a method of, and an apparatus for, voltage level shifting. A voltage level shifter includes two level shifting circuits and a differential amplifier. The differential amplifier forms a feedback loop with one level shifting circuit. The feedback loop controls the level shifting operation of both level shifting circuits. The differential amplifier can operate to provide a control signal that causes a level-shifted signal in the feedback loop to equal a target signal. The two level shifting circuits can perform their level shifting operation based on the control signal.

One of the level shifting circuits can receive a reference signal and perform a level shifting operation to provide a level-shifted reference signal. The differential amplifier can receive a target signal, such as a substantially DC voltage, and can compare the level-shifted reference signal to the target signal. The differential amplifier can provide a control signal based on the difference between the level-shifted reference signal and the target signal to cause the level-shifted reference signal to substantially equal the target signal. The control signal can also be provided to the second level shifting circuit. The second level shifting circuit can receive an input signal and perform a level shifting operation based on the control signal to provide a level-shifted version of the input signal.

The target signal can vary within a permissible range of values. Additionally, the two level shifting circuits can have the same configuration.

The level shifting circuits can each include a serial connection of a MOS transistor, a component such as a resistor, a MOS amplifier, or an electrical connection, and another MOS transistor. One MOS transistor can be connected to an input signal. The other MOS transistor can be connected to the differential amplifier and can receive the control signal from the differential amplifier to provide a level-shifting current that corresponds to the control signal. The level shifting circuit can create a controllable voltage drop by allowing the level-shifting current to flow through the MOS transistors and the component.

In one aspect of the disclosed invention, a voltage level shifter can perform a first level shifting operation to provide a level-shifted reference signal, provide a control signal to the first level-shifting operation to cause the level-shifted reference signal to substantially match a target signal, and perform a second level-shifting operation based on the control signal to provide a level-shifted version of an input signal. The first level-shifting operation and the second level-shifting operation can occur simultaneously. The voltage level shifter can provide the control signal by comparing the level-shifted reference signal to the target signal. When the level-shifted reference signal is greater than the target signal, the voltage level shifter can increase the control signal. When the level-shifted reference signal is less than the target signal, the voltage level shifter can decrease the control signal.

In one aspect of the disclosed invention, the disclosed technology provides means for voltage level shifting. A voltage level shifter can include two level shifting means and a difference amplifier means. The difference amplifier means forms a feedback loop with one level shifting means. The feedback loop controls the level shifting operation of both level shifting means. The difference amplifier means can operate to provide a control signal that causes a level-shifted signal in the feedback loop to equal a target signal. The two level shifting means can perform their level shifting operations based on the control signal.

One of the level shifting means can receive a reference signal and perform a level shifting operation to provide a level-shifted reference signal. The difference amplifier means can receive a target signal, such as a substantially DC voltage, and can compare the level-shifted reference signal to the target signal. The difference amplifier means can provide a control signal based on the difference between the level-shifted reference signal and the target signal, to cause the level-shifted reference signal to substantially equal the target signal. The control signal can also be provided to the second level shifting means. The second level shifting means can receive an input signal and perform a level shifting operation based on the control signal to provide a level-shifted version of the input signal. The two level shifting means can have the same configuration.

Further features of the invention, its nature and various advantages, will be more apparent from the accompanying drawings and the following detailed description of the various embodiments.

DETAILED DESCRIPTION

Figure 1:
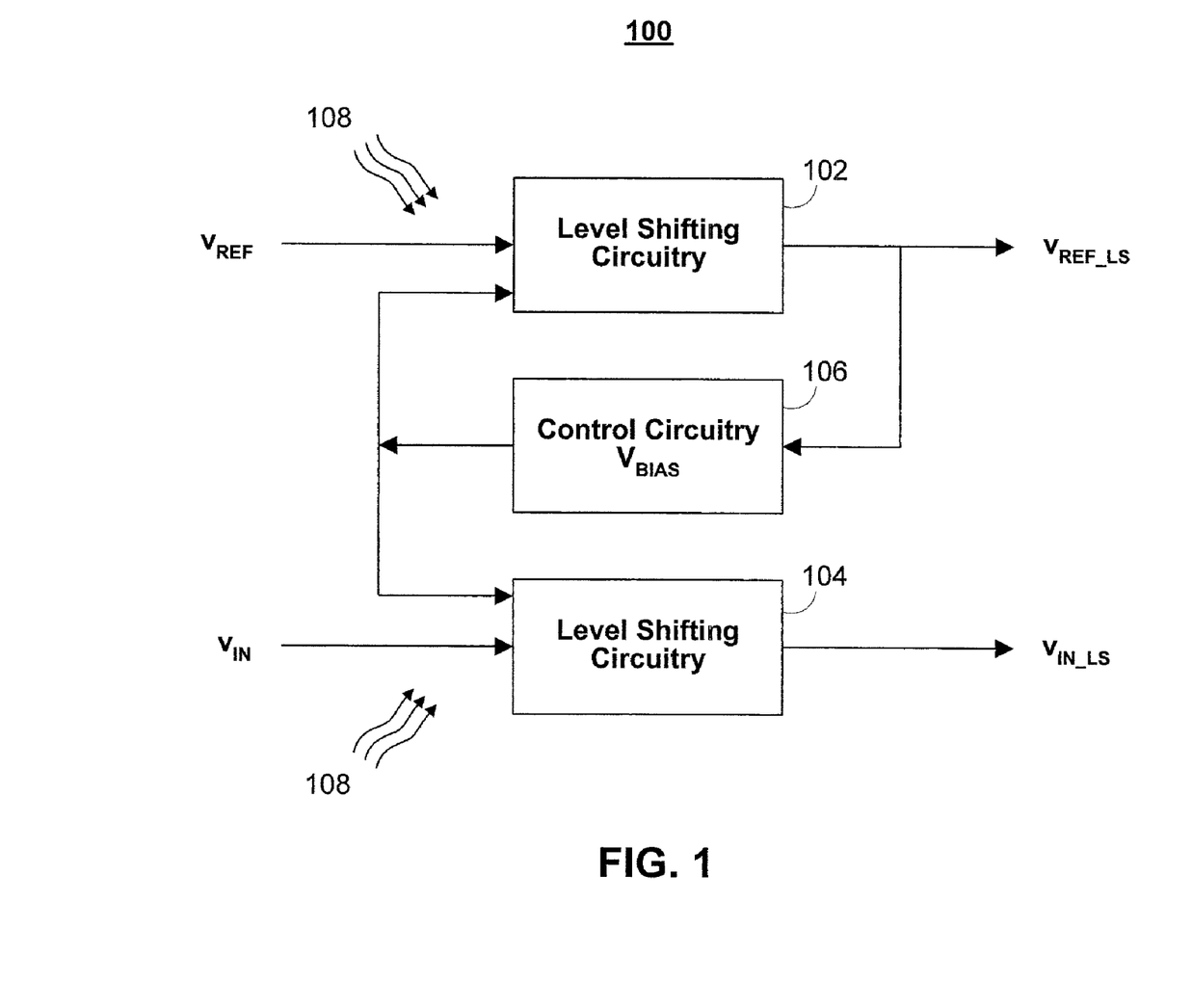
FIG. 1 is a block diagram of an exemplary voltage level shifter.

In accordance with aspects of the disclosed invention, FIG. 1 shows a block diagram of an exemplary voltage level shifter 100. The voltage level shifter 100 receives a reference signal $v_{REF}$ and an input signal $v_{IN}$, which may originate from another circuit, device, or system. In one embodiment, the voltage level shifter 100 can be configured to receive a reference signal $v_{REF}$ that is a constant voltage signal. The input signal $v_{IN}$ can have a defined voltage swing, and the reference signal $v_{REF}$ can be the midpoint voltage between the swing levels. In another embodiment, the voltage level shifter 100 can be configured to receive a reference voltage $v_{REF}$ that is a varying signal.

The illustrated voltage level shifter 100 includes two level shifting circuits 102,104. The first level shifting circuit 102 receives the reference signal $v_{REF}$ and performs a level shifting operation to provide a level-shifted reference signal $v_{REF\_LS}$. The second level shifting circuit 104 receives the input signal $v_{IN}$ and performs a level shifting operation to provide an output signal $v_{IN\_LS}$ that is a level-shifted version of the input signal. The control circuit 106 controls the level shifting operations of both the first and the second level shifting circuits. As shown in the illustration, the control circuit 106 provides the same output (control) signal to both the first level shifting circuit 102 and the second level shifting circuit 104.

The control signal provided by the control circuit 106 determines the amount of level shifting that occurs in the level shifting circuits 102,104. The first level shifting circuit 102 operates based on the output of the control circuit 106, and the control circuit 106 operates based on the output of the first level shifting circuit 102, thereby forming a feedback loop that can be used to control the amount of level shifting in the first level shifting circuit 102. Because the same control signal from the control circuit 106 is also received by the second level shifting circuit 104, the feedback loop also operates to control the amount of level shifting in the second level shifting circuit 104. If the first level shifting circuit 102 and the second level shifting circuit 104 have the same configuration, then the amount of level shifting that occurs in both may be substantially the same. From hereon, it will be assumed that the two level shifting circuits 102,104 have the same configuration.

In the illustrated voltage level shifter 100, the control circuit 106 receives a target signal $v_{BIAS}$. In one embodiment, the control circuit 106 can operate to compare the level-shifted reference signal $v_{REF\_LS}$ to the target signal $v_{BIAS}$, and to produce a control signal based on the comparison that will cause the level-shifted reference signal $v_{REF\_LS}$ to substantially equal the target signal $v_{BIAS}$. Thus, it can be seen that the feedback loop can be a negative feedback loop. The control circuit 106 maintains the amount of level-shifting in the first level shifting circuit 102 at ($v_{REF}-v_{BIAS}$). Because the control circuit 106 also controls the second level shifting circuit 104, and the two level shifting circuits have the same configuration, the amount of level-shifting in the second level-shifting circuit is the same. Thus, the level-shifted version of the input signal is $V_{IN\_LS}=V_{IN}-(V_{REF}-V_{BIAS})$.

Figure 2:
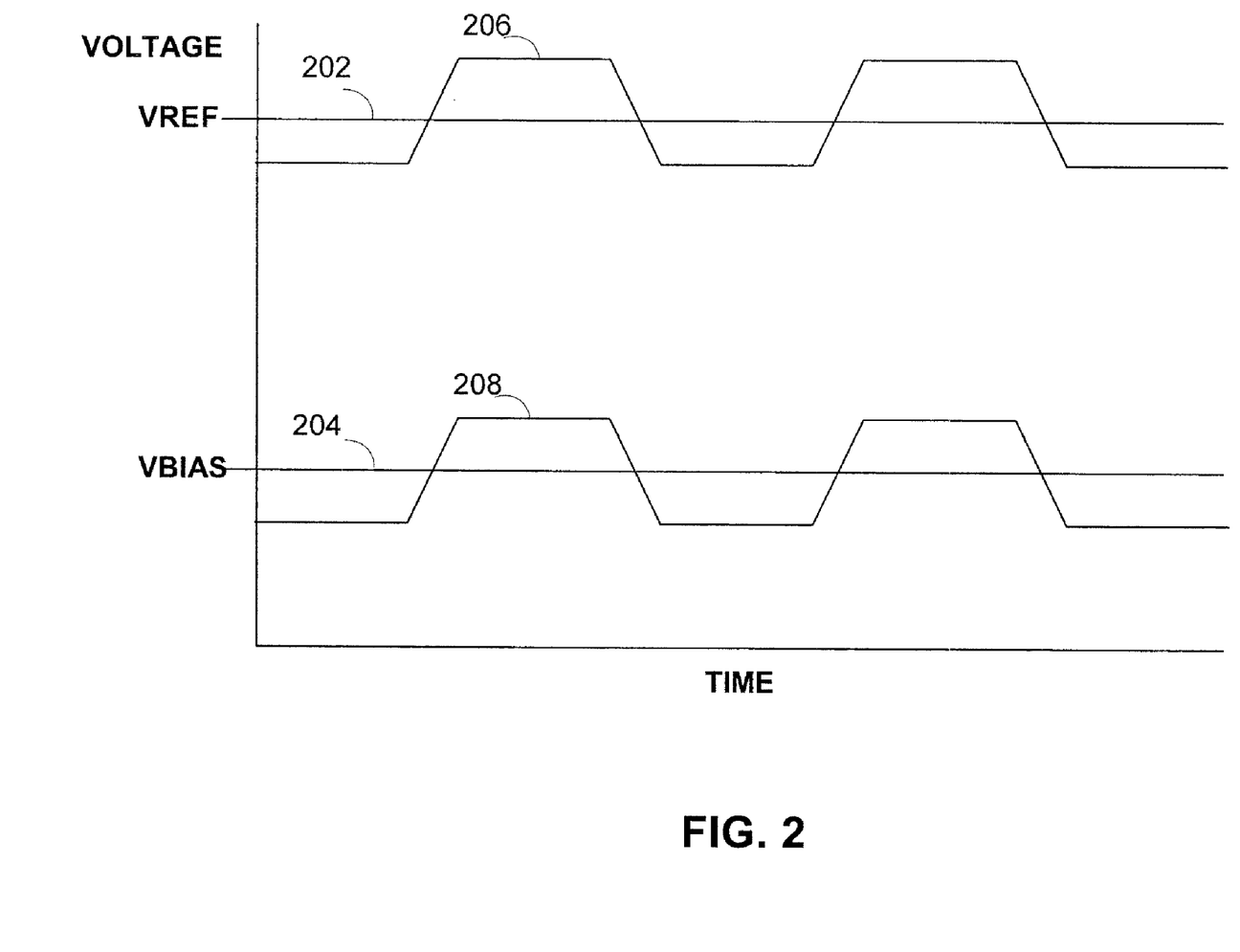
FIG. 2 is a graph of exemplary voltages in a voltage level shifter.

For example, with reference also to FIG. 2, the reference signal $V_{REF}$ 202 and the target signal $V_{BIAS}$ 204 are shown as constant voltage signals. The amount of level shifting in the level shifting circuits 102,104 is the difference between the value of $V_{REF}$ 202 and the value of $V_{BIAS}$ 204. More level shifting occurs when the difference is greater, and less level shifting occurs when the difference is smaller. However, because the signals $V_{REF}$ 202 and $V_{BIAS}$ 204 are illustrated as constant signals, the amount of level shifting is constant over time. An exemplary input signal $V_{IN}$ 206 is also shown in FIG. 2. The input signal $V_{IN}$ 206 is level-shifted by ($V_{REF}-V_{BIAS}$) to produce the level-shifted input signal $V_{IN\_LS}$ 208. Because the amount of level shifting remains constant, the level-shifted input signal $V_{IN\_LS}$ 208 maintains the same shape as the input signal $V_{IN}$ 206.

Referring again to FIG. 1, the voltage level shifter 100 may be affected by varying environmental and/or operating conditions 108, which can include temperature variations, power supply noise, interference signals, effects of device aging, and other conditions. These conditions 108 may cause components in the voltage level shifter 100 to operate differently. However, the control circuit 106 enables the voltage level shifter 100 to adapt to these conditions by maintaining the amount of voltage level shifting at ($V_{REF}-V_{BIAS}$). This control technique may be more effective when the conditions 108 affect the input signal $v_{IN}$ in the same way that the reference signal $v_{REF}$ is affected, or when at least some of the components of the voltage level shifter 100 are manufactured using the same process and/or same materials, and in a sufficiently small circuit area so that environmental or operating conditions 108 which affect the first level shifting circuit 102 also affect the second level shifting circuit 104 in substantially the same way.

The illustrations in FIGS. 1-2 are exemplary and do not limit the scope of the disclosed invention. For example, although the reference signal 204 and the target signal 206 are illustrated as constant signals, they can also be signals that vary. Although the target signal $v_{BIAS}$ is shown to be internal to the control circuit 106, it can originate outside the control circuit 106 or outside the voltage level shifter 100. Additionally, the voltage level shifter 100 can operate even when the target signal 206 is affected by environmental or operating conditions 108. In one embodiment, the voltage level shifter 100 can operate when the target signal 206 falls within a particular range of values. This range of values can be determined by, for example, the voltage requirements of a circuit (not shown) coupled to the voltage level shifter 100. In one embodiment, the range of values can be defined by an optimal common-mode voltage of a circuit coupled to the voltage level shifter 100 and some voltage variation above and/or below the optimal common-mode voltage.

Figure 3:
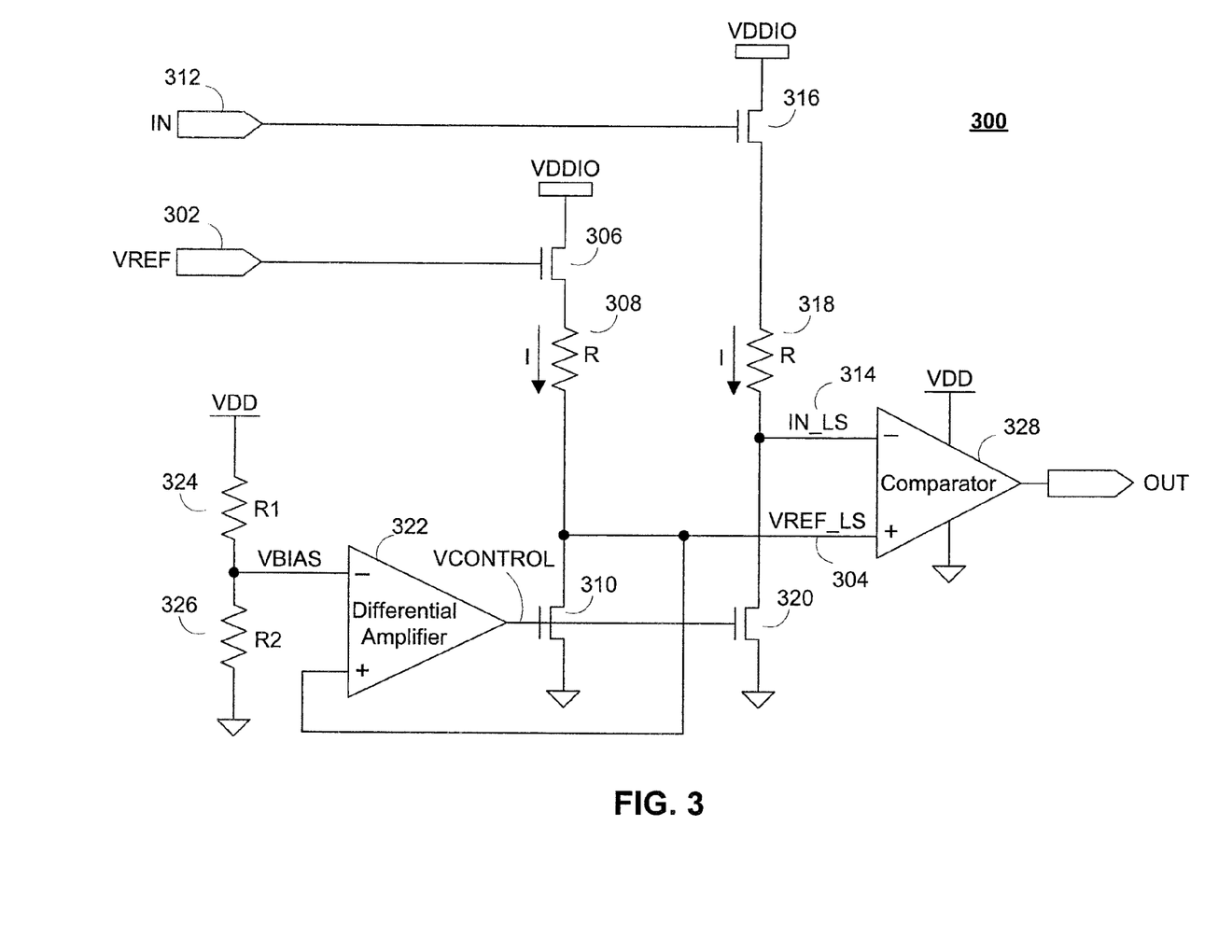
FIG. 3 is an exemplary circuit diagram of a voltage level shifter according to the block diagram of FIG. 1.

Referring now to FIG. 3, there is shown an exemplary circuit implementation of the voltage level shifter of FIG. 1. The voltage level shifter 300 includes a reference signal node 302 and a level-shifted reference signal node 304. The circuitry corresponding to the first level shifting circuit of FIG. 1 includes a metal-oxide semiconductor (MOS) transistor 306 that is connected to the reference signal node 302, a resistance such as a resistor 308, and a MOS transistor 310 that is controlled by a feedback loop. The voltage level shifter 300 also includes an input signal node 312 and a level-shifted input signal node 314. The circuitry corresponding to the second level shifting circuit of FIG. 1 includes a MOS transistor 316 connected to the input signal pin 312, a resistance such as a resistor 318, and a MOS transistor 320 that is controlled by the feedback loop. The feedback loop includes a voltage divider 324,326 that provides a target voltage $v_{BIAS}$. A differential amplifier 322 in the feedback loop receives the target voltage $v_{BIAS}$ as well as the level-shifted reference signal 304. The differential amplifier 322 provides a control signal $v_{CONTROL}$ to the MOS transistors 310,320 based on a difference between the target voltage $v_{BIAS}$ and the level-shifted reference signal 304. The control signal controls the level shifting circuitry in a way that sets $V_{REF\_LS}$ equal to $V_{BIAS}$, thereby maintaining the amount of level shifting at ($V_{REF}-V_{BIAS}$). The differential amplifier 322 can be an operational transconductance amplifier.

As shown by the illustrated embodiment, the circuits corresponding to the first and the second level shifting circuits have the same components and arrangement. Furthermore, in order to provide the same amount of level shifting in the first level shifting circuit and the second level shifting circuit, the top transistors 306,316 should be matched, the resistances 308,318 should have the same values, and the bottom transistors 310,320 should be matched. As used herein, "matched transistors" refer to transistors having substantially the same operating parameters and characteristics. Because the bottom transistors 310,320 are matched and are both controlled by the control signal $V_{CONTROL}$, the amount of current flowing through the first and second level shifting circuit will be the same, and the top transistors 306,316 in the first and second level shifting circuits will also operate in the same manner.

At the output of the voltage level shifter 300, the level-shifted reference signal 304 and the level-shifted input signal 314 can be coupled to a comparator 328 that operates based on a voltage source VDD. The comparator 328 can have an input voltage requirement that defines a permissible range of values for the target voltage $v_{BIAS}$, such that the comparator may operate correctly only when the target voltage varies within this range. The range can include, for example, an optimal common-mode voltage for the comparator, which can be, but is not limited to, VDD/2, and the range can include a variation of voltage above and/or below the optimal common-mode voltage. In one embodiment, the comparator can adjust the amplitude levels of the level-shifted input signal $V_{IN\_LS}$ to produce an output binary signal that swings rail-to-rail between VDD and ground.

It will be understood that the illustrated embodiment of FIG. 3 is exemplary and does not limit the scope of the disclosed invention. For example, the level shifting circuit and the feedback loop are exemplary and the described features and operations can be implemented and performed by other circuits that are not shown or described. For example, the transistors need not be MOS transistors. The comparator is also exemplary, and the voltage level shifter can be coupled to another circuit that uses a level-shifted input voltage and/or a level-shifted reference voltage.

Figure 4:
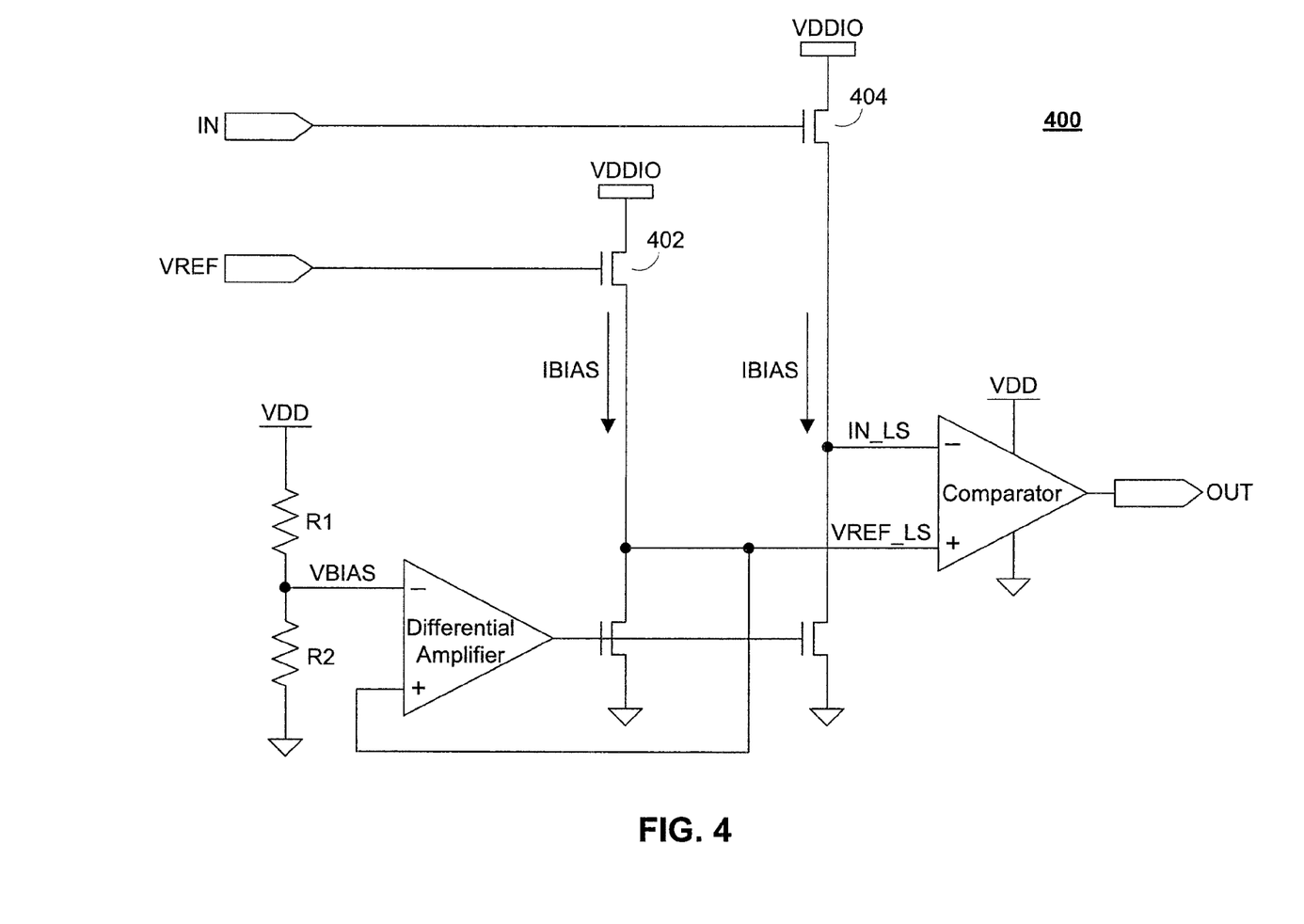
FIG. 4 is another exemplary circuit diagram of a voltage level shifter according to the block diagram of FIG. 1.
Figure 5:
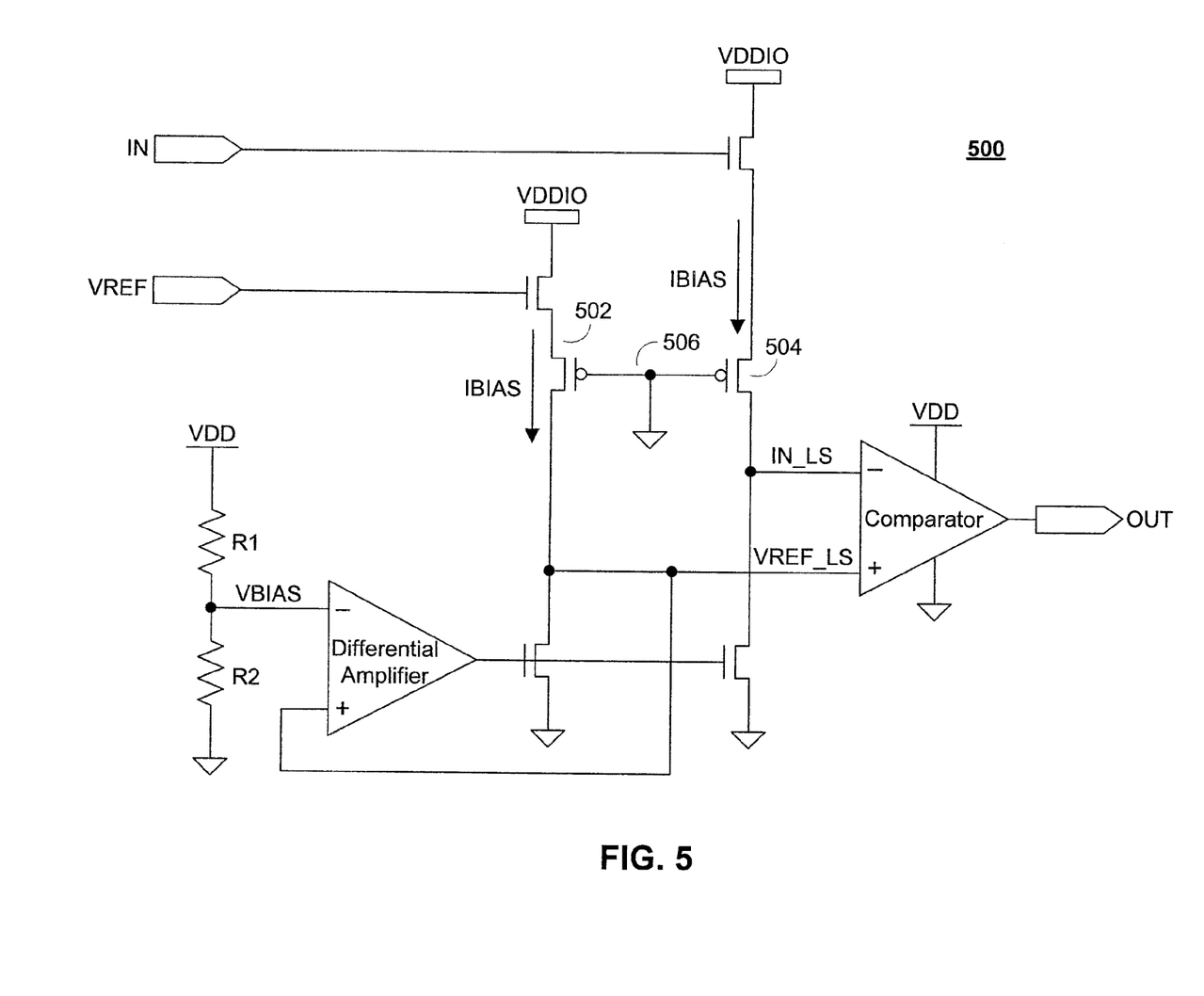
FIG. 5 is another exemplary circuit diagram of a voltage level shifter according to the block diagram of FIG. 1.

FIGS. 4-5 show other exemplary embodiments of a voltage level shifter and are variations of the circuit of FIG. 3.

In the embodiment of FIG. 4, the voltage level shifter 400 includes a reference signal side and an input signal side, as before. The level shifting circuits on both sides do not include the separate resistances 308,318 of FIG. 3. Rather, the voltage drops provided by the FIG. 3 resistances 308,318 are replaced by increasing the gate-to-source voltage $v_{GS}$ of the top transistors 402,404. This increased $v_{GS}$ can be obtained through careful sizing of the transistors 402,404 to achieve desirable values of currents and voltages in the level-shifter circuit. By not using the resistors 308,318 of FIG. 3, the voltage level shifter 400 can have an improved transient response to input-signal variations. One reason for this improvement is that the resistors limit the amount of current for charging and discharging parasitic capacitances on the IN_LS and VREF_LS nodes. Without the resistors, the input transistors 402,404 can charge and discharge the parasitic capacitances with greater speed.

FIG. 5 shows an embodiment of a voltage level shifter 500 in which the resistors 308,318 of FIG. 3 are omitted and p-type MOS amplification devices 502, 504 have been added. As shown in the illustration, these devices 502,504 can be connected in a common-gate configuration 506 and can operate to amplify the reference signal $v_{REF}$ and the input signal $v_{IN}$. One reason this amplification may be desirable is because the incoming signals may have been attenuated before reaching the voltage level shifter 500. The amplifying devices 502,504 can partially or fully counteract the attenuation by strengthening the input signals.

Figure 6:
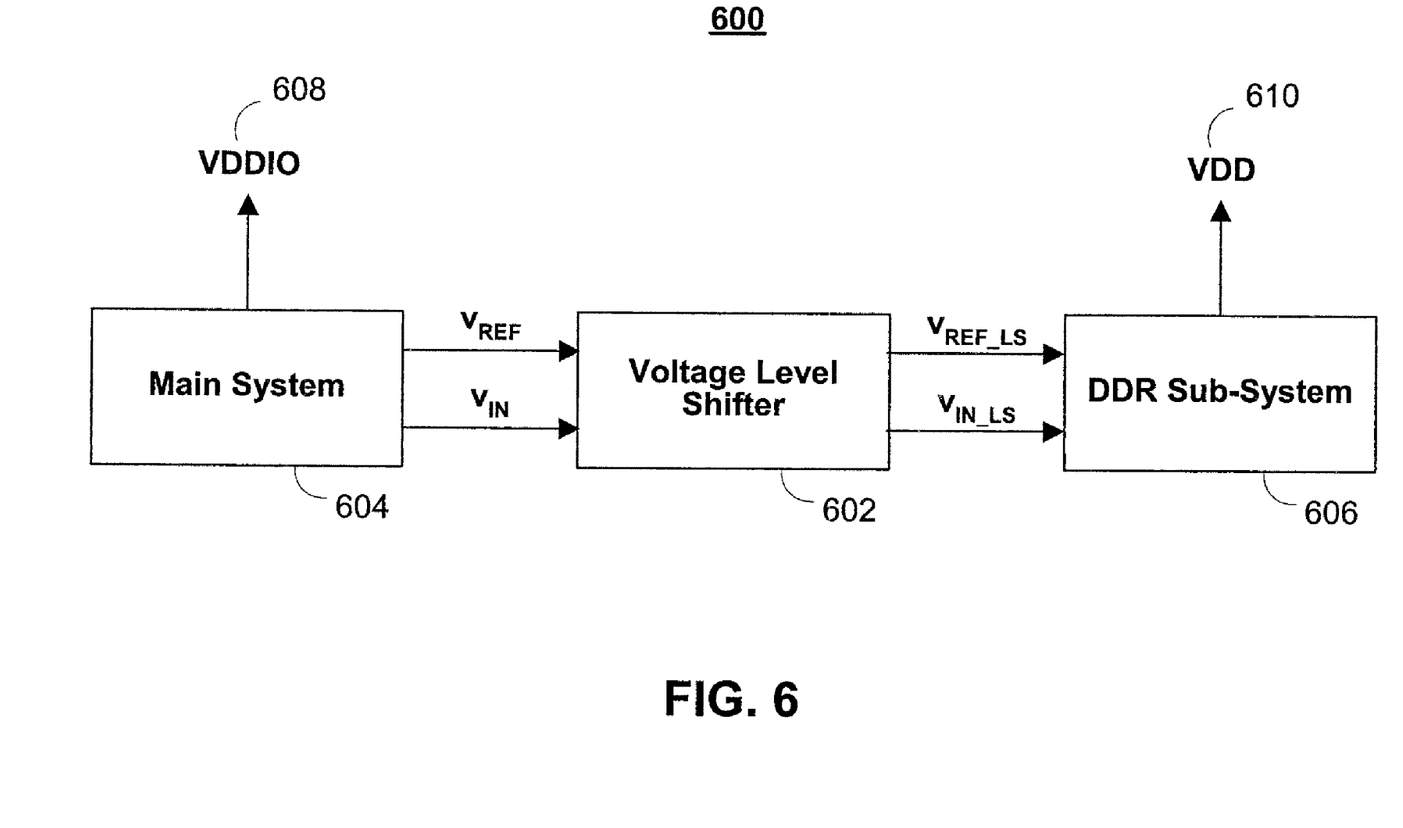
FIG. 6 is a block diagram of an exemplary system that uses a voltage level shifter.

FIG. 6 shows a system 600 that includes a dual data rate (DDR) memory sub-system. The system 600 includes a voltage level shifter 602 according to the disclosed invention that performs voltage adjustment between a main system 604 and the DDR sub-system 606. The voltage level shifter 602 may be needed because the main system 604 and the DDR sub-system 606 may operate based on different operating voltages 608,610.

Figure 7A:
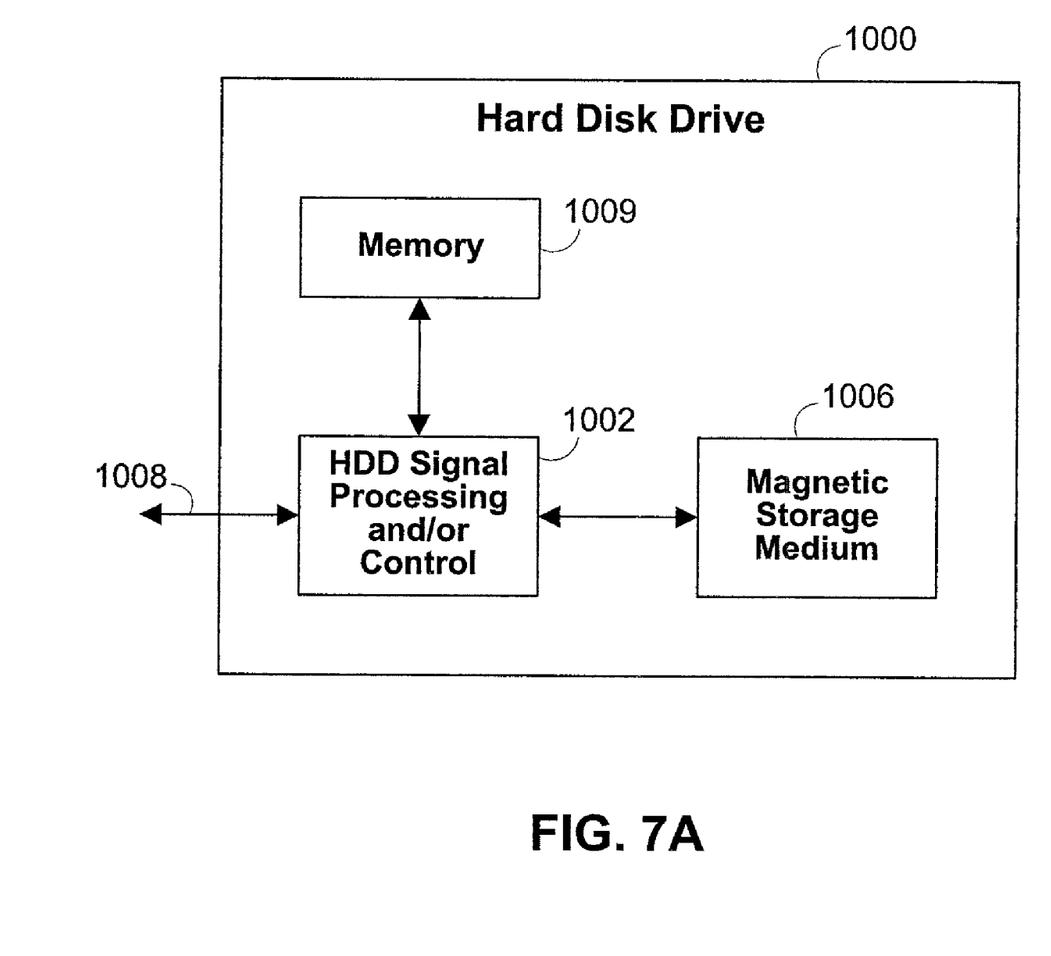
FIG. 7A is a block diagram of an exemplary hard disk drive that can employ the disclosed technology.

Referring now to FIGS. 7A-7G, various exemplary implementations of the present invention are shown. Referring now to FIG. 7A, the present invention can be implemented in a hard disk drive 1000. The present invention may implement either or both signal processing and/or control circuits, which are generally identified in FIG. 7A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 7B:
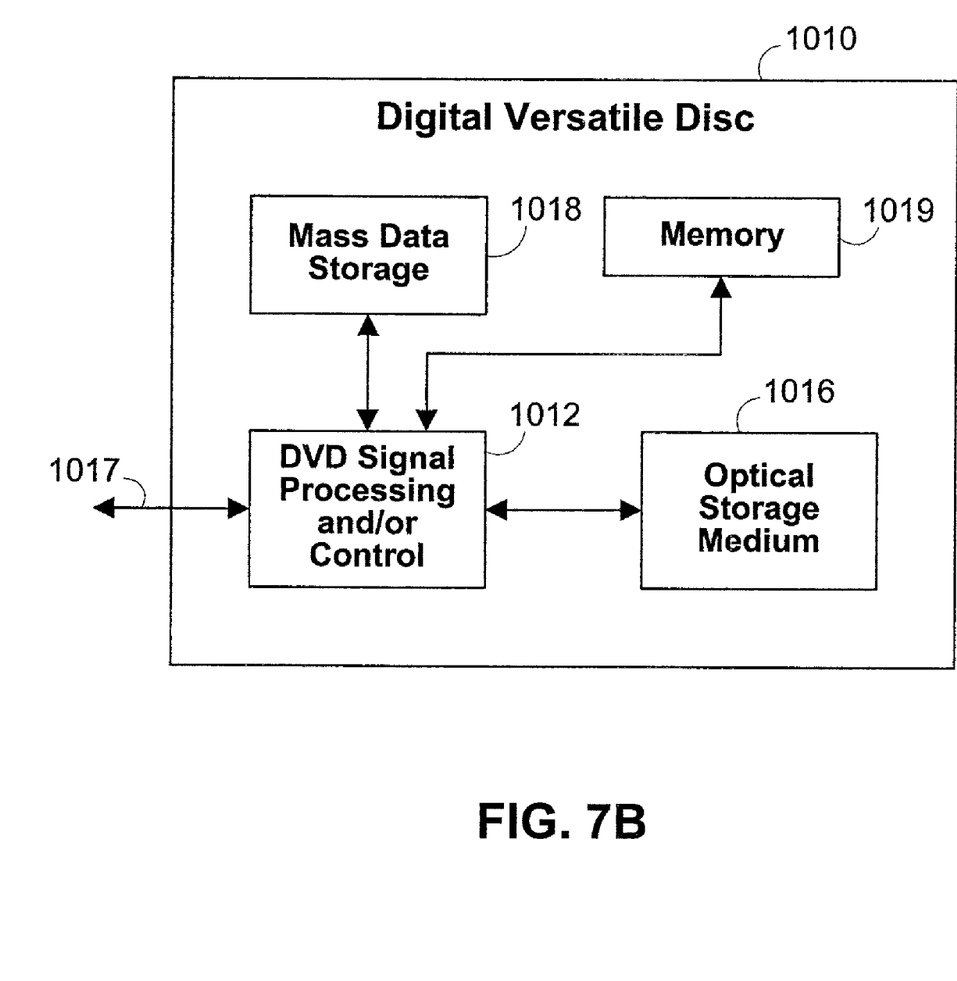
FIG. 7B is a block diagram of an exemplary digital versatile disc that can employ the disclosed technology.

Referring now to FIG. 7B, the present invention can be implemented in a digital versatile disc (DVD) drive 1010. The present invention may implement either or both signal processing and/or control circuits, which are generally identified in FIG. 7B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 7A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 7C:
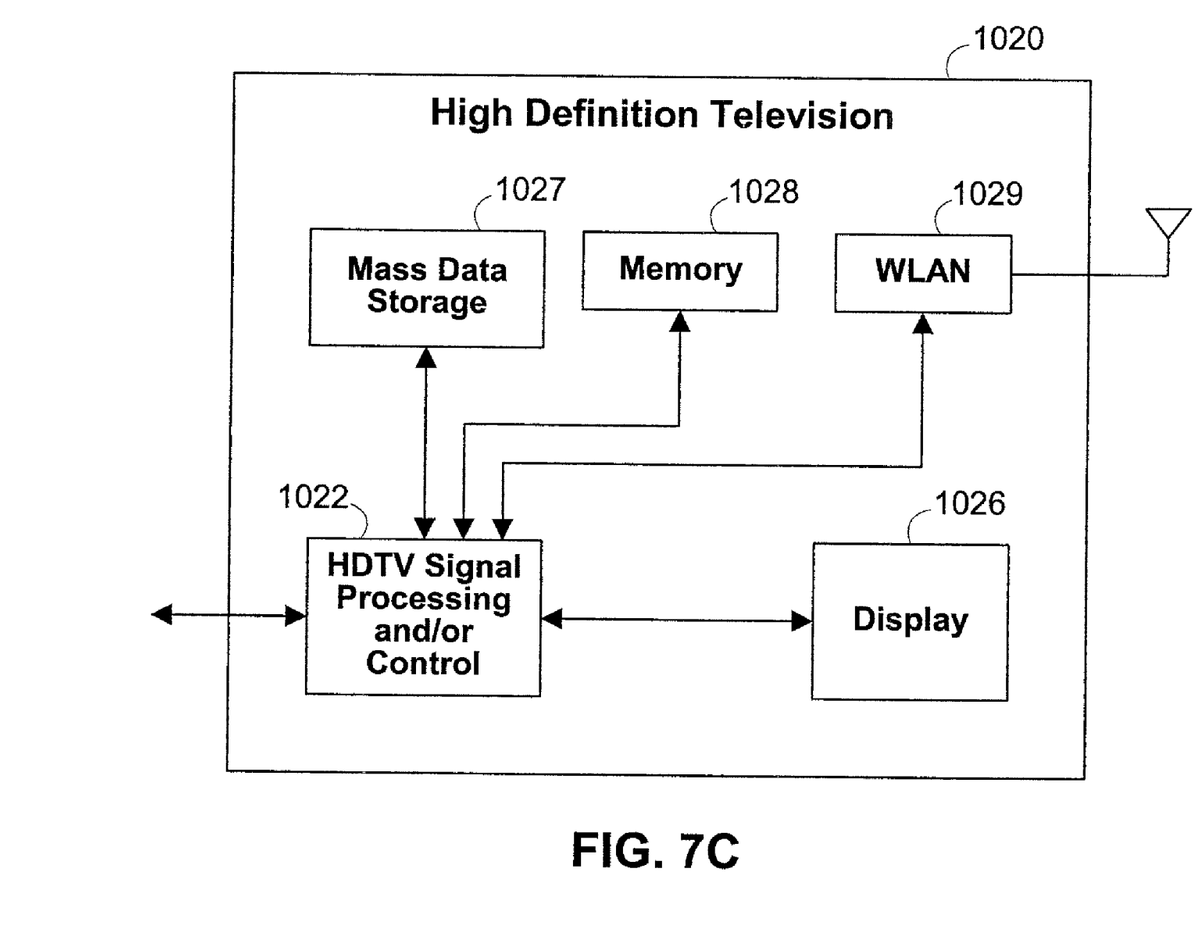
FIG. 7C is a block diagram of an exemplary high definition television that can employ the disclosed technology.

Referring now to FIG. 7C, the present invention can be implemented in a high definition television (HDTV) 1020. The present invention may implement either or both signal processing and/or control circuits, which are generally identified in FIG. 7C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 7D:
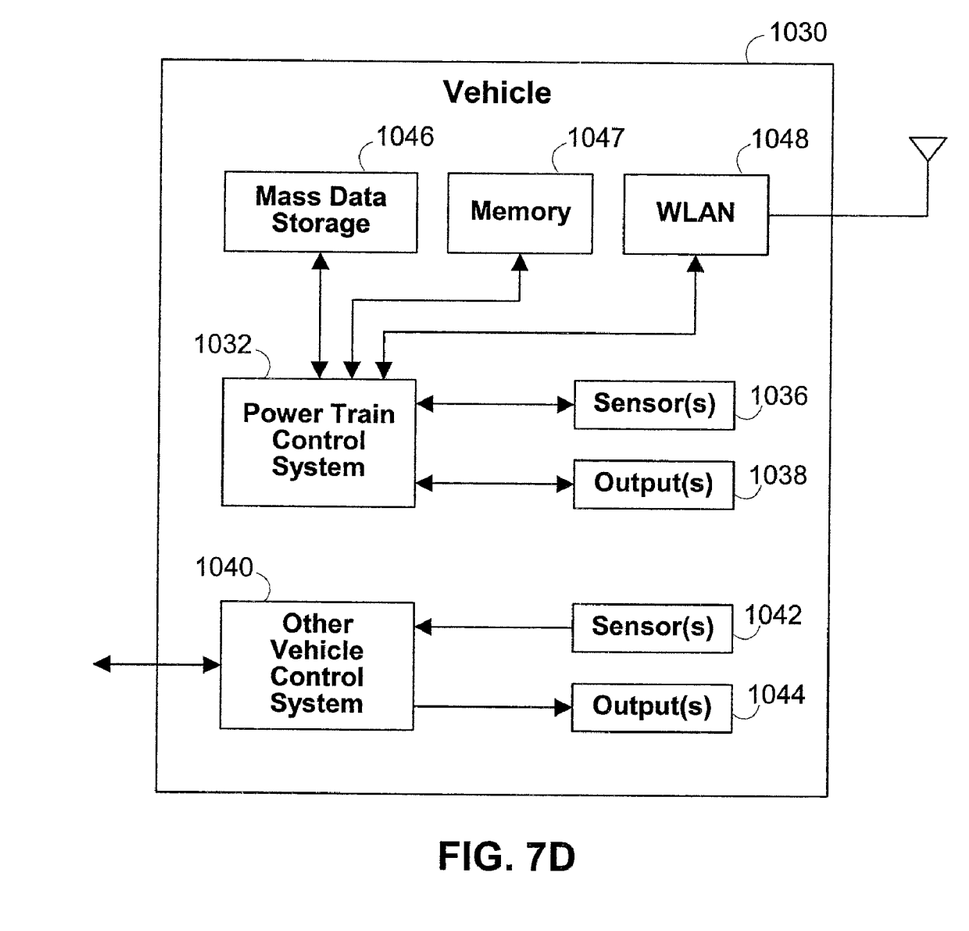
FIG. 7D is a block diagram of an exemplary vehicle that can employ the disclosed technology.

Referring now to FIG. 7D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices, for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 7E:
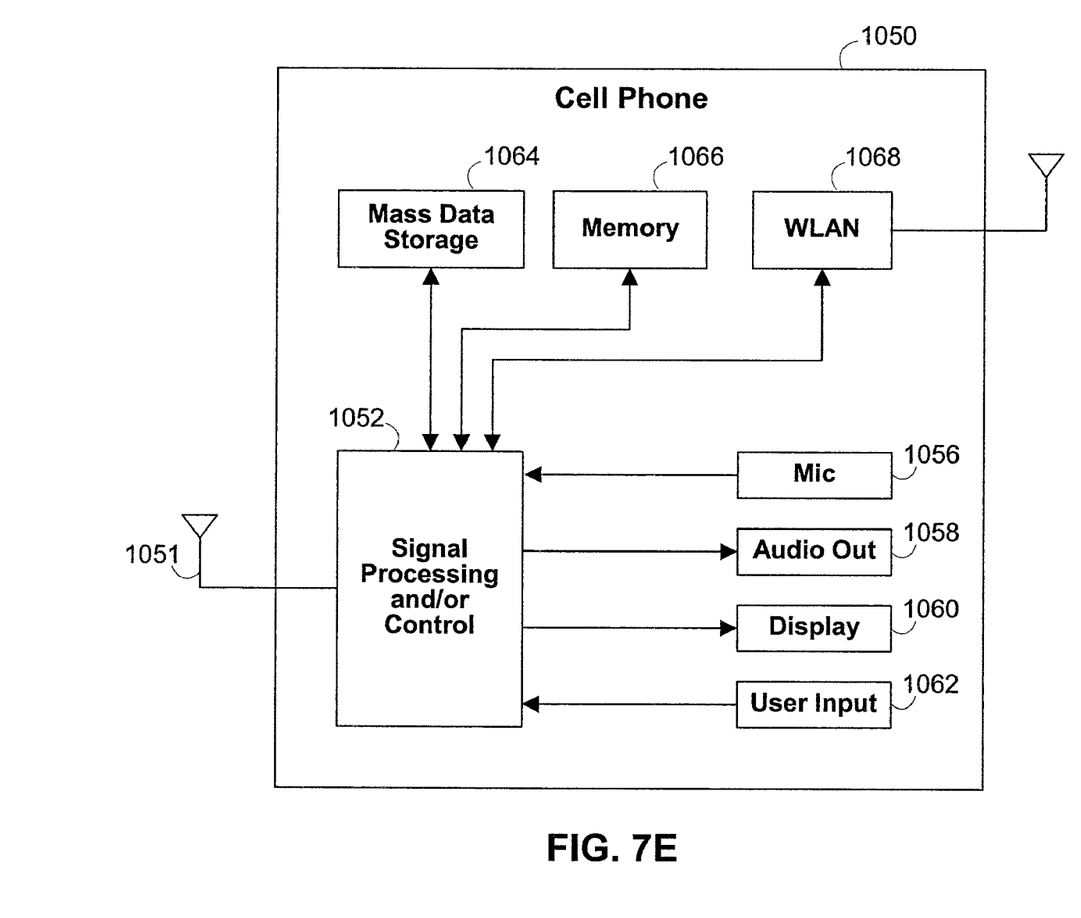
FIG. 7E is a block diagram of an exemplary cell phone that can employ the disclosed technology.

Referring now to FIG. 7E, the present invention can be implemented in a cellular phone 1050 that may include a cellular antenna 1051. The present invention may implement either or both signal processing and/or control circuits, which are generally identified in FIG. 7E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 7F:
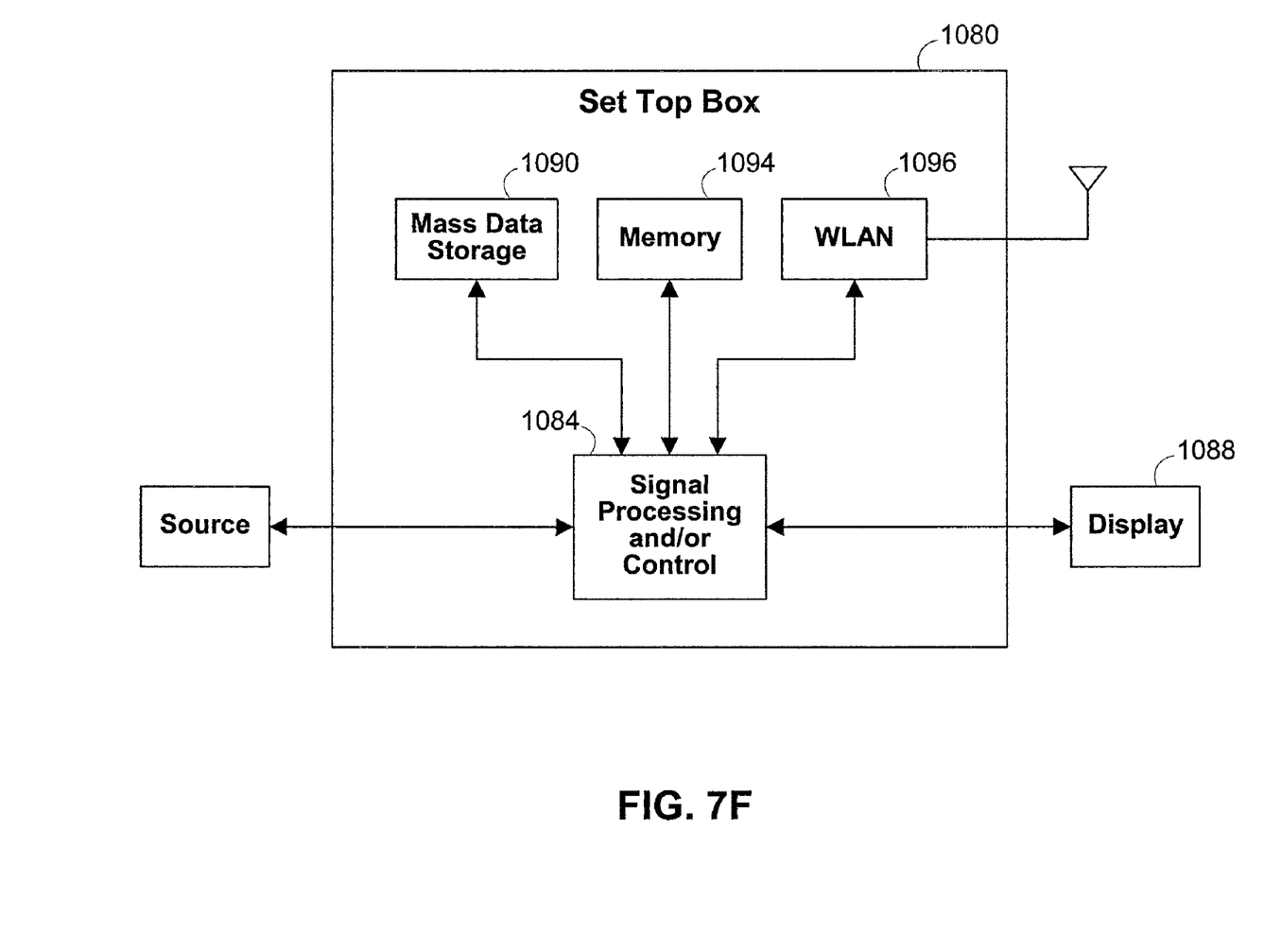
FIG. 7F is a block diagram of an exemplary set top box that can employ the disclosed technology.

Referring now to FIG. 7F, the present invention can be implemented in a set top box 1080. The present invention may implement either or both signal processing and/or control circuits, which are generally identified in FIG. 7F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices, for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 7G:
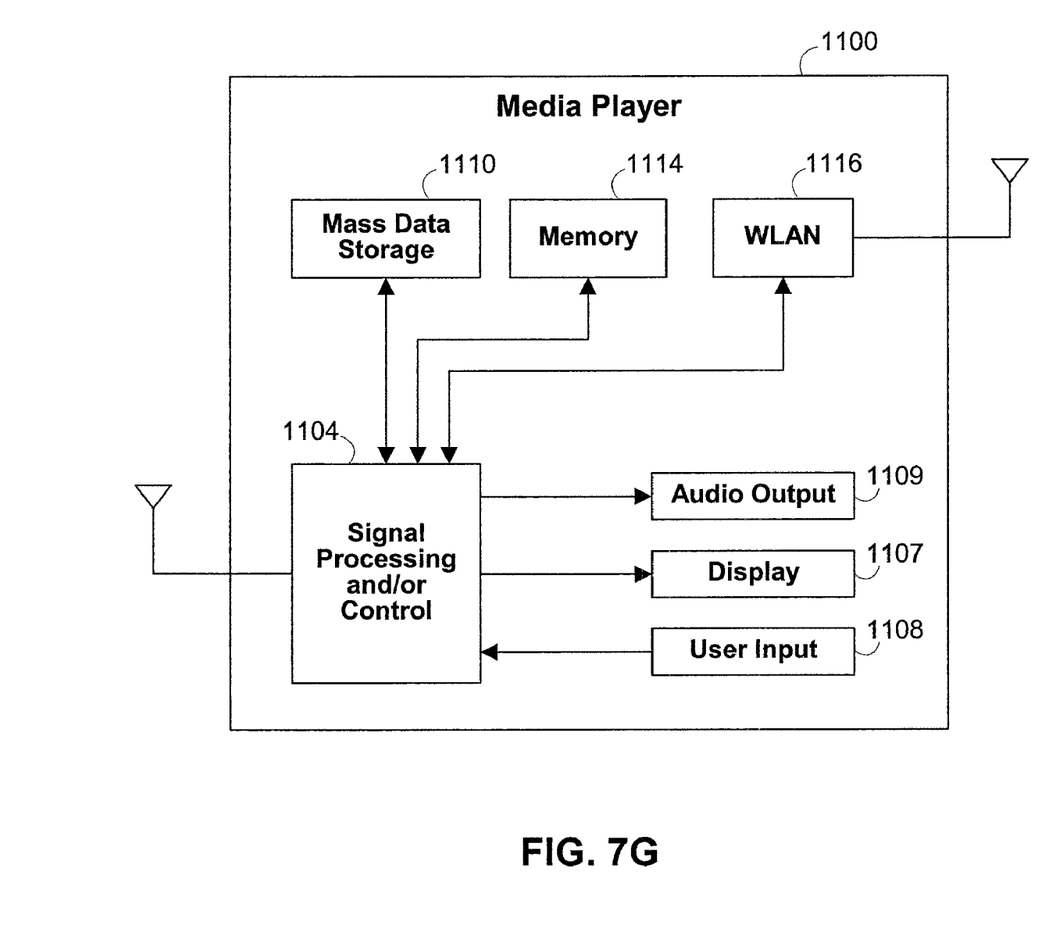
FIG. 7G is a block diagram of an exemplary media player that can employ the disclosed technology.

Referring now to FIG. 7G, the present invention can be implemented in a media player 1100. The present invention may implement either or both signal processing and/or control circuits, which are generally identified in FIG. 7G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far are a method and apparatus for voltage level shifting. The disclosed method, components, and circuits can be implemented using various analog and digital circuit means, including circuitry made from various types, sizes, and/or configurations of transistors, MOS transistors, field effect transistors, BJTs, diodes, resistors, capacitors, inductors, integrated circuits, operation amplifiers, operational transconductance amplifiers, comparators, and/or current sources. The disclosed embodiments and illustrations are exemplary and do not limit the scope of the disclosed invention as defined by the following claims.

What is claimed is:

1. An electronic device including a memory, comprising:
   a main system that operates at a first operating voltage;
   a voltage level shifter configured to:
      receive a reference signal and an input signal from the main system; and
      output a level-shifted reference signal that is based on the received reference signal and a feedback signal generated from the level-shifted reference signal; and
      output a level-shifted input signal that is based on the received reference signal and the feedback signal; and
   a memory sub-system that operates at a second operating voltage, different from the first operating voltage, and that receives at least the level shifted input signal and the level-shifted reference signal.

2. The system of claim 1, wherein the voltage level shifter is further configured to generate a control signal that is based on the feedback signal and provided to the voltage level shifter for controlling the shifting of the reference signal and the input signal.

3. The system of claim 1, wherein the voltage level shifter further comprises:
   a first level shifting circuit that outputs a level-shifted reference signal based on the received reference signal and is responsive to a control signal that is based on the feedback signal; and
   a second level shifting circuit that receives the input signal and the control signal that provides a level-shifted input signal based on the input signal and the control signal.

4. The system of claim 3, wherein the control signal is based on the difference between the level-shifted reference signal and a target signal, and wherein the control signal causes the first level shifting circuit to provide an amount of level shifting that is substantially equal to a difference between the reference signal and the target signal.

5. The system of claim 1, wherein the voltage level shifter further comprises a comparator circuit to adjust the amplitude levels of the level-shifted input signal to produce an output binary signal.

6. The system of claim 3, wherein the first level shifting circuit creates a controllable voltage drop by allowing the level-shifting current to flow through a resistive component.

7. The system of claim 3, wherein the second level shifting circuit creates a controllable voltage drop by allowing the level shifting current to flow through a resistive component.

8. The system of claim 3, wherein the first level shifting circuit and the second level shifting circuit include substantially the same circuit configuration.

9. The system of claim 4, wherein the target signal and the reference signal are substantially constant signals.

10. The system of claim 1, wherein the memory is dual data rate memory.

11. A method of voltage level shifting in an electronic device having a memory, comprising:
    receiving a reference signal and an input signal from a main system;
    producing a level-shifted reference signal that is based on the received reference signal and a feedback signal generated from the level-shifted reference signal
    producing a level-shifted input signal that is based on the received reference signal and the feedback signal;
    producing a control signal based on the feedback signal;
    controlling the production of the level shifted reference signal and the production of the level shifted input signal with said control signal; and
    operating a memory sub-system using at least the level shifted input signal and the level-shifted reference signal.

12. The method of claim 11, wherein producing the level-shifted reference signal comprises level shifting the reference signal by an amount substantially equal to a difference between the reference signal and a target signal.

13. The method of claim 12, wherein producing the level shifted input signal based on the control signal comprises level shifting the input signal by an amount substantially equal to the difference between the reference signal and the target signal.

14. The method of claim 11, wherein providing the control signal further comprises:
increasing the control signal when the level-shifted reference signal is greater than the target signal; and
decreasing the control signal when the level-shifted reference signal is less than the target signal.

15. The method of claim 11, wherein the level shifted reference signal and the level shifted input signal are produced simultaneously.

16. The method of claim 12, wherein the target signal is a substantially constant signal.

17. The method of claim 11, wherein the memory is dual data rate memory.

18. The method of claim 11, further comprising adjusting the amplitude levels of the level-shifted input signal to produce an output binary signal.

* * * * *